(12) United States Patent
Agraffeil

(10) Patent No.: US 9,536,741 B2
(45) Date of Patent: Jan. 3, 2017

(54) METHOD FOR PERFORMING ACTIVATION OF DOPANTS IN A GAN-BASE SEMICONDUCTOR LAYER BY SUCCESSIVE IMPLANTATIONS AND HEAT TREATMENTS

(71) Applicant: COMMISSARIAT À L' ÉNERGIE ATOMIQUE ET AUX ÉNERGIES ALTERNATIVES, Paris (FR)

(72) Inventor: Claire Agraffeil, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/846,376

(22) Filed: Sep. 4, 2015

(65) Prior Publication Data
US 2016/0093495 A1    Mar. 31, 2016

(30) Foreign Application Priority Data

Sep. 26, 2014  (FR) ...................................... 14 59131

(51) Int. Cl.
| | |
|---|---|
| *H01L 21/265* | (2006.01) |
| *H01L 21/324* | (2006.01) |
| *H01L 29/20* | (2006.01) |
| *H01L 29/207* | (2006.01) |

(52) U.S. Cl.
CPC ... *H01L 21/26546* (2013.01); *H01L 21/26553* (2013.01); *H01L 21/324* (2013.01); *H01L 21/3245* (2013.01); *H01L 29/2003* (2013.01); *H01L 29/207* (2013.01)

(58) Field of Classification Search
None
See application file for complete search history.

(56) References Cited

U.S. PATENT DOCUMENTS

| | | | |
|---|---|---|---|
| 5,306,662 A | 4/1994 | Nakamura et al. | |
| 5,766,695 A | 6/1998 | Nguyen et al. | |
| 2006/0286784 A1* | 12/2006 | Usov ................ | H01L 21/26546 438/515 |

(Continued)

FOREIGN PATENT DOCUMENTS

WO        82/01619 A1     5/1982

OTHER PUBLICATIONS

Cayrel, F. et al. "Si implanted in GaN grown on sapphire using AlN and oxide cap layers," Nuclear Instruments & Methods in Physics Research, Section—B/Beam Interactions With Materials and Atoms, vol. 272, pp. 137-140, 2012.

(Continued)

*Primary Examiner* — Asok K Sarkar
(74) *Attorney, Agent, or Firm* — Oliff PLC

(57) ABSTRACT

The method for performing activation of n-type or p-type dopants in a GaN-base semiconductor includes the following steps: providing a substrate including a GaN-base semiconductor material layer, performing the following successive steps at least twice: implanting electric dopant impurities in the semiconductor material layer, performing heat treatment so as to activate the electric dopant impurities in the semiconductor material layer, a cap layer covering the semiconductor material layer when the heat treatment is performed, two implantation steps of electric dopant impurities being separated by a heat treatment step.

20 Claims, 4 Drawing Sheets

(56) References Cited

U.S. PATENT DOCUMENTS

| | | | |
|---|---|---|---|
| 2007/0134834 A1 | 6/2007 | Lee et al. | |
| 2007/0269968 A1 | 11/2007 | Saxler et al. | |
| 2010/0133656 A1 | 6/2010 | Hager, IV et al. | |
| 2010/0147835 A1 | 6/2010 | Mulpuri et al. | |
| 2010/0171126 A1 | 7/2010 | Briere | |
| 2012/0068188 A1 | 3/2012 | Feigelson et al. | |
| 2013/0056793 A1 | 3/2013 | Srinivasan | |
| 2016/0061528 A1* | 3/2016 | Derenge | F27D 1/02 432/254.1 |

OTHER PUBLICATIONS

Lorenz, K et al. "High-temperature anealing and optical activation of Eu-implanted GaN," Applied Physics Letters, American Institute of Physics, vol. 85, No. 14, pp. 2712-2714, 2004.

Hager, C. E. et al. "Activation of ion implanted Si in GaN using a dual AlN annealing cap," J. Appl. Phys., vol. 105, pp. 033713-1 to 033713-7, 2009.

Miranda, S. M. C. et al, "Sequential multiple-step europium ion implantation and annealing of GaN," Physica Status Solidi (C), vol. 11, No. 2, pp. 253-257, 2014.

Chan, J. S. et al, "Thermal Annealing Characteristics of Si and Mg-implanted GaN thin films," Applied Physics Letters, American Institute of Physics, vol. 68, No. 19, pp. 2702-2704, 1996.

Nogales, E. et al, "Failure Mechanism of AlN nanocaps used to protect rare earth-implanted GaN during high temperature annealing," Applied Physics Letters, American Institute of Physics, vol. 88, No. 3, pp. 031902-1 to 031902-3, 2006.

Porowski, et al, "Annealing of GaN Under High Pressure of Nitrogen," Journal of Physics: Condensed Matter, vol. 14, pp. 11097-11110, 2002.

Feigelson, et al, "Multicycle Rapid Thermal Annealing Technique and its Application for the Electrical Activation of Mg Implanted in GaN," Journal of Crystal Growth, vol. 350, pp. 21-26, 2012.

Aluri, et al, "Microwave Annealing of Mg-implanted and in situ Be-doped GaN," Journal of Applied Physics, American Institute of Physics, vol. 108, No. 8, pp. 083103-1 to 083103-7, 2010.

Hwang, et al, "Enhancing P-Type Conductivity in Mg-Doped GaN Using Oxygen and Nitrogen Plasma Activation," Japanese Journal of Applied Physics, Japan Society of Applied Physics, vol. 44, No. 4A, pp. 1726-1729, 2005.

Kim, et al, "Reactivation of Mg Acceptor in Mg-doped GaN by Nitrogen Plasma Treatment," Applied Physics Letters, American Institute of Physics, vol. 76, No. 21, pp. 3079-3081, 2000.

Shintani, et al, "Etching of GaN Using Phosphoric Acid," Journal of the Electrochemical Society, vol. 123, No. 5, pp. 706-713, 1976.

Gupta, "Plasma Immersion Ion Implantation (PIII) Process-Physics and Technology," International Journal of Advancements in Technology, vol. 2, No. 4, pp. 471-490, 2011.

Wu, et al, "Positive and Negative Effects of Oxygen in Thermal Annealing of p-type GaN," Semiconductor Science Technology, vol. 27, 085017, pp. 1-3, 2012.

Nomoto, et al, "Remarkable Reduction of On-Resistance by Ion Implantation in GaN/AlGaN/GaN HEMTs with Low Gate Leakage Current," IEEE Electron Device Letters, IEEE Service Center, vol. 28, No. 11, pp. 939-941, 2007.

International Business Machines Corp., "Three-Dimensional Semiconductor Device Structures Using Channeled Ion Implantation and Annealing Techniques," IBM Technical Disclosure Bulletin, vol. 32, No. 4A, pp. 358-359, 1989.

Whelan, et al, "The Dependence of the Radiation Damage Formation on the Substrate Implant Temperature in GaN during Mg ion implantation," Journal of Applied Physics, American Institute of Physics, vol. 98, No. 1, pp. 013515-1 to 013515-5, 2005.

International Business Machines Corp., "Forming of Low Resistance Ohmic Contacts to III-V Semiconductors," IBM Technical Disclosure Bulletin, vol. 32, No. 7, pp. 141-142, 1989.

Anonymous, "Barrier Height Enhancement by Recoil Implantation," Research Disclosure, Mason Publications, No. 292, pp. 932, 1988, XP000104853, ISSN:0374-4353.

Cao, et al, "Implanted p-n junctions in GaN," Solid State Electronics, vol. 43, pp. 1235-1238, 1999.

Baharin, et al, "Experimental and Numerical Investigation of the Electrical Characteristics of Vertical n-p Junction Diodes Created by Si Implantation into p-GaN," Institute of Electrical and Electronics Engineers, pp. 12-15, 2008.

U.S. Appl. No. 14/849,237, filed Sep. 9, 2015 in the name of Agraffeil.

U.S. Appl. No. 14/859,860, filed Sep. 21, 2015 in the name of Agraffeil.

U.S. Appl. No. 14/855,761, filed Sep. 16, 2015 in the name of Agraffeil.

Jun. 15, 2016 Office Action issued in U.S. Appl. No. 14/855,761.
Feb. 25, 2016 Office Action issued in U.S. Appl. No. 14/849,237.
Mar. 24, 2016 Office Action issued in U.S. Appl. No. 14/859,860.

* cited by examiner

METHOD FOR PERFORMING ACTIVATION OF DOPANTS IN A GAN-BASE SEMICONDUCTOR LAYER BY SUCCESSIVE IMPLANTATIONS AND HEAT TREATMENTS

BACKGROUND OF THE INVENTION

The invention relates to a method for performing activation of dopants in a semiconductor layer.

STATE OF THE ART

Ion implantation is commonly used to dope semiconductors. In the case of n-doping (excess electrons) performed for example by implantation of $Si^+$ ions in a GaN layer, the activation ratio obtained with current methods is close to 100%.

To perform p-doping (excess holes) in a semi-conductor such as GaN on the other hand, known methods do not enable such good results to be obtained, in particular when the dopant impurities are Mg atoms or a mixture of P and Mg atoms.

One of the reasons why the activation ratio is less good is that the atomic radiuses of magnesium and gallium are very different (1.36 Å for one as opposed to 1.26 Å for the other). The magnesium atoms therefore have difficulty in placing themselves in a substitutional position during implementation of the doping method. This results in a particular difficulty to activate this type of dopants—the implanted dose has to be large, and the activation heat treatment has to be performed at a high temperature for a long period.

It is also proved that non-doped GaN presents a consequent residual n-type doping. In addition, contamination by H, O or Si atoms also occurs due to the epitaxy method and/or to steps of subsequent processes that may be performed. At the outcome, the n-type dopant concentration is in general about $10^{13}$ to $10^{18}$ atoms/cm$^2$. A high dose of p-type dopant species therefore has to be used to compensate the n-doping and to obtain a p-doped material. However the implanted dose can generally not exceed $5 \cdot 10^{15}$ atoms/cm$^2$, otherwise the semiconductor becomes completely amorphous.

After ion implantation, to restore the crystal quality of the semiconductor and to activate the dopants, heat treatment is conventionally performed. In the case where the dopants were input by MetalOrganic Vapor Phase Epitaxy (MOCVD), activation annealing can also be used.

A first method can consist in performing a standard heat treatment (furnace annealing). If the temperature of the heat treatment is lower than 850° C., the dopants can diffuse into the semiconductor and impairment of the latter by evaporation is limited. However, the dopant activation ratio remains very low as the heat treatment temperature is too low and/or the time during which an industrially applicable heat treatment can be performed is too short.

Heat treatment at a temperature of more than 850° C. results in impairment of the GaN-base semiconductor. It is therefore necessary to deposit a protective cap layer to prevent the semiconductor from being damaged. Generally, the cap layers used are made from a base formed by AlN, $SiO_2$, or $Si_3N_4$. Furnace annealing (FA) or Rapid Thermal Annealing (RTA) and Rapid Thermal Processing (RTP) can then be performed. The temperature applied when the heat treatment is performed can be comprised between 1000 and 1300° C. if the quality of the cap layer is sufficient and the substrate on which the GaN is deposited is made from silicon. If the semiconductor is deposited on a sapphire block, the heat treatment can be performed over a temperature range extending up to 1600° C.

It is also possible to combine heat treatment with application of a high pressure able to be up to 15 kbar and a controlled atmosphere, for example a nitrogen-base atmosphere. In this case, deposition of a cap layer is not necessary. This dopant activation method is described in the publication "Annealing of GaN under high pressure of nitrogen" (S. Porowski et al. 2002, Journal of Physics: Condensed Matter, Vol 14).

These methods are alternatives to circumvent the instability of the GaN layer at temperatures of more than 850° C., but do not present much more convincing results or are much more expensive on account of the specificity of the equipment used.

The GaN surface is therefore generally covered by a cap layer. The nature, quality, and thickness of this layer will define an activation "thermal budget", i.e. the temperature able to be applied during the heat treatment, and the period of this treatment. Solutions have enabled this thermal budget to be increased to increase the dopant activation ratio. However, applying heat treatment at high temperature for a certain time gives rise to other problems such as in-depth diffusion of the dopant impurities, which results in a loss of dose and a deformation of the concentration profile of the implanted dopants. Another drawback is contamination of the GaN layer by n-type dopant species (Si, O, C) or contaminants (H).

The curve plots of FIG. 1 show SIMS analyses representing the concentration of implanted Mg dopant impurities in a GaN-base semiconductor deposited on a silicon substrate. Implantation is performed by an ion beam having an energy of 200 keV. The two plots present the concentration profiles in the GaN before (plot A) and after (plot B) standard heat treatment FA at 1100° C. Before heat treatment (plot A), the Mg concentration is maximal at a depth comprised between 0.1 and 0.3 µm, and then decreases greatly for larger depths. After heat treatment at 1100° C. (plot B), a Mg concentration peak is observed at the surface of the semiconductor, followed by a large concentration decrease, a concentration plateau for a depth comprised between 0.15 and 0.25 µm, and then a decrease for larger depths. The dopant concentration profile is greatly inhomogeneous, and the dose loss is high. It is divided by two compared with the initial dose in the course of the heat treatment.

OBJECT OF THE INVENTION

An object of the invention consists in implementing an activation method of n-type or p-type dopants in a GaN-base semiconductor that is efficient and inexpensive in order to be able to be implemented on an industrial scale.

For this purpose, the method comprises the following steps:
 providing a substrate comprising a GaN-base semiconductor material layer,
 performing the following successive steps at least twice:
  implanting electric dopant impurities in the semiconductor material layer,
  performing heat treatment so as to activate the electric dopant impurities in the semiconductor material layer, a cap layer covering the semiconductor material layer when the heat treatment is performed,
 two implantation steps of electric dopant impurities being separated by a heat treatment step.

According to one embodiment, the cap layer can be removed after at least one of the heat treatments, and then deposited on the semiconductor material layer again before the next heat treatment. In this case, the cap layer can be comprised between 5 and 500 nm, advantageously between 5 and 100 nm, and preferentially between 5 and 40 nm.

In alternative manner, the cap layer is used for several successive heat treatments, and its thickness can be comprised between 5 and 500 nm, advantageously between 5 and 150 nm, and preferentially between 80 and 120 nm.

The material of the cap layer can be chosen from $SiO_2$, $Si_3N_4$, and AlN.

Furthermore, at each implantation step, an intermediate dose greater than 10% of the total dose to be implanted can be implanted in the semiconductor material layer, and the electric dopant impurities can be implanted at a different depth from that obtained when the previous implantation steps were performed.

According to one embodiment, at least one of the heat treatment steps can be performed by atmospheric annealing at a temperature comprised between 1100° C. and 1300° C. for a duration of 1 to 7 hours. At least one of the heat treatment steps can also be performed in a controlled atmosphere at a pressure of less than 15 kbar, at a temperature comprised between 1000° C. and 1600° C. for a duration of 1 to 20 minutes. At least one of the heat treatment steps can also be a combination of at least two anneals of different durations and temperatures.

In the case of p-doping, the electric dopant impurities can be chosen from Mg, P, N, Ca, Zn or C. If the required doping is n-type, the electric dopant impurities can be chosen from Si, Be, Ge, or O.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 2:
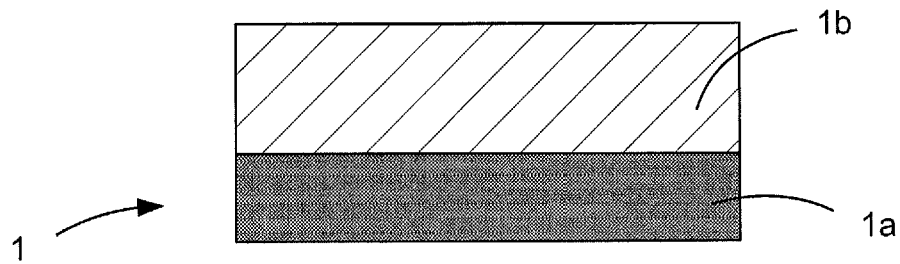
FIGS. 2-7 illustrate an embodiment of the doping method, in schematic manner.

The dopant activation method is implemented from a substrate 1 advantageously comprising a support 1a for example made from silicon, sapphire, $Al_2O_3$, or SiC and a GaN-base semiconductor material layer 1b (cf. FIG. 2). In alternative manner, substrate 1 can be made from bulk GaN.

When substrate 1 is a bulk GaN block, it is possible to cover the back surface with cap layers advantageously identical to those deposited on substrate 1 on the front surface, and which will be described in the following. The front surface of substrate 1 is defined here as being the surface impacted by the beam of dopant impurities, and the back surface as being the surface opposite the front surface.

Fabrication of substrate 1 can comprise a first cleaning step of support 1a, such as for example RCA cleaning if support 1a is made from silicon.

Semiconductor material layer 1b can then be fabricated according to a particular embodiment by epitaxial growth directly on support 1a. The material of support 1a has to be chosen carefully to have similar lattice parameters to those of semiconductor material layer 1b in order for the latter to grow in a coherent manner. To improve the quality of semiconductor material layer 1b, an intermediate layer formed by an AlGaN-base material with a thickness of at least 1 µm may be deposited on support 1a before epitaxial growth of layer 1b (embodiment not represented). For example, for a support 1a made from sapphire, GaN-base semiconductor material layer 1b can be deposited directly on support 1a if the latter is made from sapphire. On the other hand, if the support is made from silicon, it is judicious to deposit an AlGaN-base buffer layer.

It should be understood that what is meant by AlGaN-base material is a material comprising between 0 and 50% atomic of Ga and at least 50% cumulated atomic for the Al and N atoms. The AlGaN-base material can therefore be AlN.

When fabrication of semiconductor material layer 1b has been completed, the latter can advantageously have a thickness comprised between 5 nm and 10 µm, preferentially between 500 nm and 1.5 µm, and ideally equal to 1 µm.

According to another alternative embodiment, semiconductor material layer 1b can be made on a silicon support 1a by a transfer technique, such as for example Smart-cut, with creation of a weakened area by ion implantation.

At this stage, it can be envisaged to perform a first implantation step or to implant dopant species directly by epitaxy when deposition of semiconductor material layer 1b is performed (implementation embodiments not represented in the figures).

When the semiconductor material layer is designed to be n-doped, Si-type dopants can be implanted in layer 1b. In alternative manner, it can be envisaged to implant other species (ions or neutral) such as Be, Ge, O instead of the Si-type impurities.

To perform p-doping, electric dopant impurities 3 such as Mg species (ions or neutral) either alone or co-implanted with P or N species (ions or neutral) can be implanted in semiconductor material layer 1b. Another option can be to implant Ca, Zn or C dopant species (ions or neutral).

Substrate 1 is designed to be subjected at least twice to dopant impurity implantation and high-temperature heat treatment steps, as will be seen further on. The quantity of implanted dopants is broken down into several successive implantation steps. Two implantation steps are separated by an annealing step. In this way, the annealing step will at least partially cure the defects generated by the previous implantation.

Figure 3:
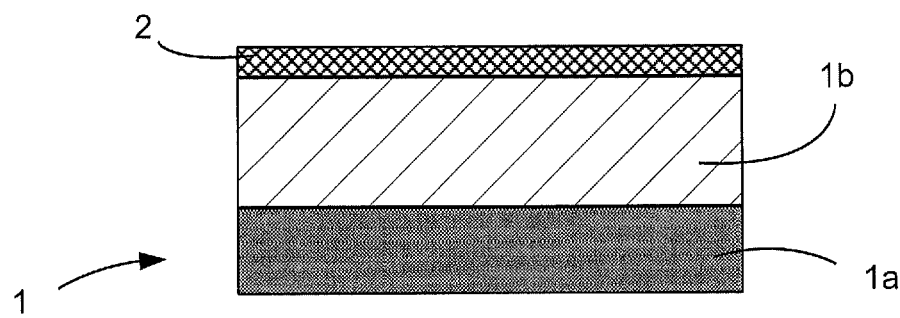

Above a temperature of about 850° C., GaN-base semiconductor material layer 1b is considerably impaired when annealing is performed. A cap layer 2 is therefore advantageously deposited in order to perform heat treatment of substrate 1 at high temperature while at the same time greatly limiting impairment of the surface of semiconductor layer 1b (cf. FIG. 3).

Figure 4:
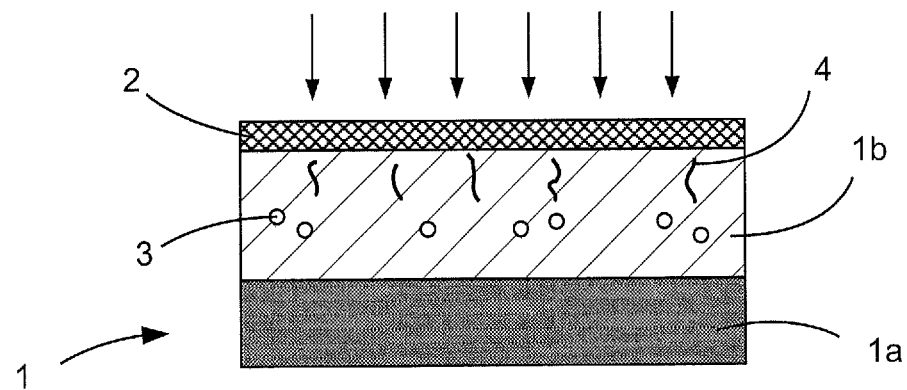
Figure 5:
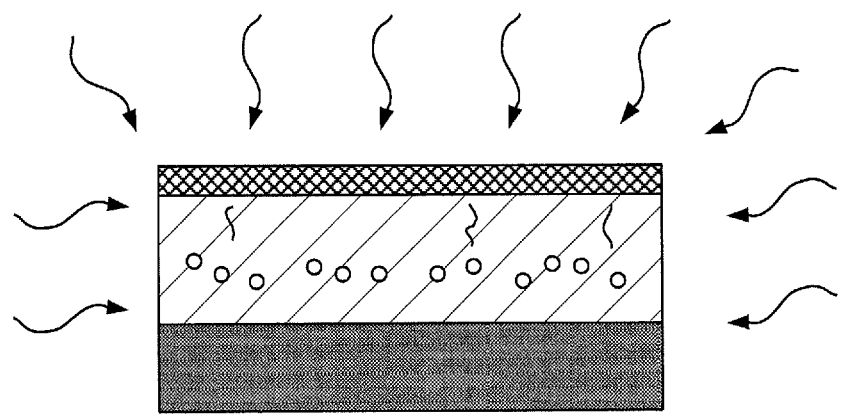
Figure 6:
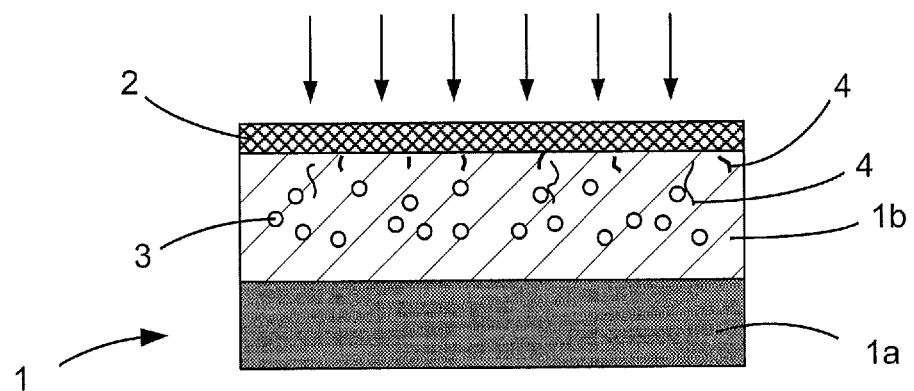
Figure 7:
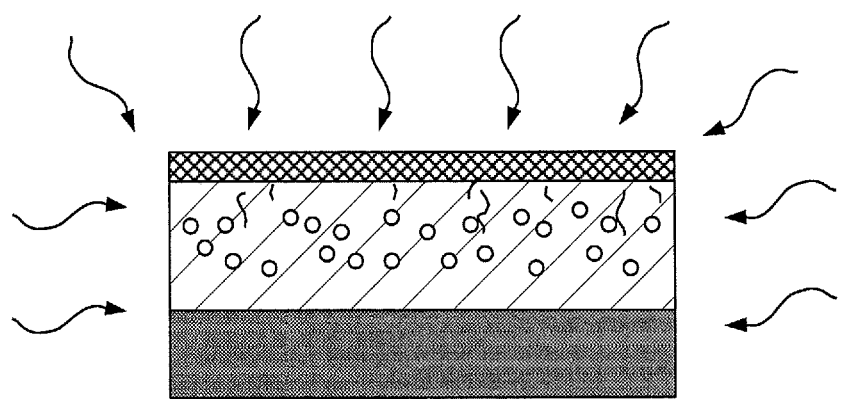

According to a first embodiment, the method can comprise a formation step of a cap layer 2 (cf. FIG. 3) performed before or after a first implantation step (cf. FIG. 4) in semiconductor material layer 1b, and before a first heat treatment step for activation of the dopant impurities (cf. FIG. 5). The new implantation step (cf. FIG. 6) and heat treatment step (cf. FIG. 7) are then performed in successive manner.

For cap layer 2 to form a compact protective barrier when the successive heat treatment steps are performed, its thickness can be comprised between 5 and 500 nm, advantageously between 5 and 150 nm, and preferentially between 80 and 120 nm. The dopant species dose loss is limited, and the dopant impurity activation ratio is improved compared with devices of the prior art.

According to an alternative embodiment, the method can successively comprise a deposition step of a cap layer 2, an implantation step, a heat treatment step designed to activate the dopants, and a removal step of cap layer 2. These steps are then repeated to perform a new implantation.

Using cap layer 2 both limits the dopant species dose loss and increases the thermal activation budget undergone by semiconductor layer 1b. Heat treatments performed at higher temperature and therefore over a shorter period can be envisaged, which enables the method to be implemented in a shorter time. The activation ratio of dopant impurities 3 is also improved.

According to another embodiment, the formation step of cap layer 2 and the implantation step can be reversed with respect to the embodiment which has just been described in the foregoing. The method can therefore successively comprise an implantation step, a formation step of a cap layer 2, a heat treatment step, and a removal step of cap layer 2. These steps are then repeated to implant semiconductor material layer 1b again.

As for the previous embodiment, depositing a new cap layer 2 before each heat treatment step makes it possible to increase the thermal budget undergone by the semiconductor layer and therefore the activation ratio of the dopants in semiconductor material layer 1b without any risk of impairment.

When cap layer 2 is eliminated after a heat treatment, the surface of the semiconductor material layer can be cleaned if required. A possible operating mode can be to perform cleaning by deoxidization by means of a $NH_4OH/H_2O$ (1:1) mixture at 60° C. In alternative manner, cleaning of the first cap layer can be performed by any other surface preparation chemistry suited to the material.

When cap layer 2 is removed on completion of each heat treatment, the cap layer does not need to be as thick as in an embodiment where it is kept throughout the activation process of dopants 3. To obtain equivalent results to those of the first embodiment, each deposited cap layer 2 can have a thickness comprised between 5 and 500 nm, advantageously between 5 and 100 nm, and preferentially between 5 and 40 nm.

The three embodiments which have just been described in the foregoing can be combined. For example, a first cap layer 2 can be deposited before the first implantation step, and a second cap layer can be deposited after the second implantation step. The second cap layer can then be kept until the dopant activation process has been completed.

In order to fabricate an n-doped semiconductor layer 1b, cap layer 2 can advantageously be made from a silicon base. The material can then be $SiO_2$ or $Si_3N_4$. Cap layer 2 can also be made from amorphous silicon although this embodiment is less advantageous. In this way, when heat treatment is performed, Si atoms can diffuse in the direction of semiconductor material layer 1b to enhance the n-doping.

Silicon-base cap layer 2 can be fabricated by Low Pressure Chemical. Vapor Deposition (LPCVD) or PECVD at a temperature comprised between 150 and 800° C., advantageously between 700 and 800° C.

When the method is implemented to fabricate a p-doped semiconductor, the material of cap layer 2 can advantageously be made from AlN. The cap layer then prevents contamination of semiconductor layer 1b by silicon or oxygen molecules and forms an efficient barrier to prevent evaporation of the nitrogen molecules of semiconductor material layer 1b when the heat treatment is performed.

Cap layer 2 made from AlN can for example be deposited by MOCVD in identical equipment to that used for epitaxial growth of semiconductor material layer 1b. Deposition can be performed at the nucleation temperature of the semiconductor material or at a lower temperature. In alternative manner, deposition of the cap layer can be performed by Physical Vapor Deposition (PVD).

Deposition of an AlN cap layer 2 can also be envisaged for n-doping of semiconductor material layer 1b. For n-doping, the AlN layer can be deposited directly on layer 1b, or after deposition of the silicon-base layer.

In alternative manner, it is also possible to perform successive depositions of AlN, Mg or MgO, and then AlN again, to form cap layer 2 on semiconductor material layer 1b.

To obtain good-quality doping in the whole of semiconductor material layer 1b, 3 to 5 successive implantations appear to be sufficient. If more than 5 implantations are performed, the implementation cost of the method becomes very high compared with the improvement of the doping of the semiconductor layer and would appear to be reserved for very specific technological applications.

A doping method comprising 3 or 4 successive implantations enables good-quality doping to be obtained at a reasonable cost and can therefore be implemented on an industrial scale.

In preferred manner, the total dose $D_t$ implanted in semiconductor material layer 1b can be comprised between $10^{15}$ and $10^{16}$ atoms/cm$^2$, and the intermediate dose $D_i$ implanted at each implantation step is more than 10% of the total dose $D_t$. Advantageously, the intermediate dose $D_i$ is comprised between 25 and 40% of the total implanted dose $D_t$.

At each implantation step, the implantation depth Z, i.e. the depth at which the concentration peak of dopant impurities 3 is located in semiconductor material 1b, can advantageously be different in order to have a more homogeneous distribution of dopant impurities 3. As the method comprises at least two implantation steps, implantation of dopant impurities 3 is performed at two different implantation depths Z at least.

According to one embodiment, the electric dopant impurities 3 can be implanted more and more deeply at each new implantation step (embodiment not represented).

The electric dopant impurities 3 can on the contrary be successively implanted less and less deeply in semiconductor material layer 1b. For this, a method consists in reducing the implantation energy at each new implantation step. This particularly advantageous embodiment is illustrated in FIGS. 4 to 7.

In the method illustrated in the figures, a first dose of dopant impurities 3 corresponding to an intermediate dose $D_i$ of the total dose is implanted in semiconductor material layer 1b (cf. FIG. 4).

Implantation of dopant impurities 3 creates structural defects 4 in the semiconductor matrix such as grain boundaries or vacancies. These defects 4 greatly limit the electric quantity of the semiconductor and have to be repaired, at least partially.

To repair defects 4 caused to semiconductor material layer 1b and to activate dopants 3, heat treatment is performed (cf. FIG. 5).

The heat treatment can for example consist in annealing at a temperature comprised between 1100 and 1300° C. for a period comprised between 1 and 7 hours.

After heat treatment, the activated dopants 3 are more numerous in the implanted area and the structural defects 4 are less numerous.

The heat treatment enables the quality of the crystal lattice of semiconductor material layer 1b to be restored and its surface state to be re-established. The mechanical and structural properties of the semiconductor are then similar to those of a semiconductor that has not undergone implantation of dopant impurities.

Implanting dopant impurities 3 in successive manner and performing heat treatment on completion of each implantation step enables a more efficient method to be obtained as the dose of activated dopant impurities 3 is higher. The doping method is also less invasive as the heat treatment enables the crystal lattice of semiconductor 1b to be reconstructed.

A second ion implantation can then be performed, advantageously with a different energy and advantageously less than the dose $D_t$ used for the first implantation. In the example illustrated in FIG. 6, dopants 3 are implanted less deeply in semiconductor material layer 1b when the second implantation is performed. As in the first implantation step, the implanted dopants have generated defects 4 in the semiconductor matrix.

This second implantation is therefore followed by a second heat treatment (cf. FIG. 7) designed both to restore the crystal quality of semiconductor material 1b and to activate dopant impurities 3 so as to guarantee a good electric quality for semiconductor material 1b.

These two repetitions of implantation and heat treatment steps can be followed by other implantation and heat treatment steps not represented in the figures.

An example of implementation of the method concerns a semiconductor layer 1b made from GaN with a thickness of 1 μm deposited on a silicon substrate 1a. A cap layer 2 made from 100 nm of $SiO_2$ is then deposited on semiconductor layer 1b in order to protect the latter. Deposition of cap layer 2 can advantageously be performed by LPCVD at a temperature comprised between 700 and 800° C.

P-doping is then performed at ambient temperature by means of $Mg^+$ ions, the total dose to be implanted being $3 \cdot 10^{15}$ atoms/cm². In a first ion implantation step, ⅔ of the total dose are implanted at an energy equal to 200 keV.

Standard furnace annealing heat treatment is then performed for a period of 4 to 6 hours on the substrate placed at a temperature of 1100° C. The heat treatment enables dopant impurities 3 to be activated in the implantation area and defects 4 created in semiconductor layer 1b during the implantation step to be partially repaired.

A second ion implantation is then performed to implant ⅙ of the total required dose, i.e. $0.5 \cdot 10^{15}$ atoms/cm². Dopant impurities 3 are implanted with an energy of 100 keV so as to be positioned in an area closer to the surface of semiconductor layer 1b.

A second heat treatment similar to the first heat treatment is then performed so as to repair defects 4 created by the second implantation and to activate dopant impurities 3.

Finally, a third implantation is implemented to implant the remaining ⅙ of the total required dose, i.e. $0.5 \cdot 10^{15}$ atoms/cm². Dopant impurities 3 are advantageously implanted at a lower energy, for example 50 keV so as to be positioned closer to the surface of semiconductor layer 1b. A third heat treatment similar to the first two is then performed in order to activate dopants 3 implanted during the third implantation step. This also enables a part of the defects created in semiconductor matrix 1b to be repaired.

Figure 1:
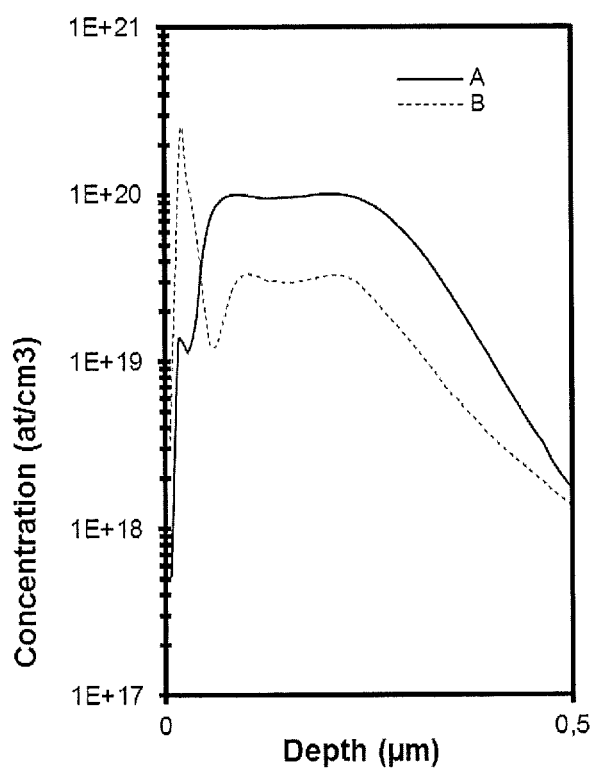
FIG. 1, presented in the state of the art, presents a $Mg^+$-type dopant implantation profile in a GaN-base semiconductor before and after standard furnace annealing heat treatment at 1100° C.
Figure 8:
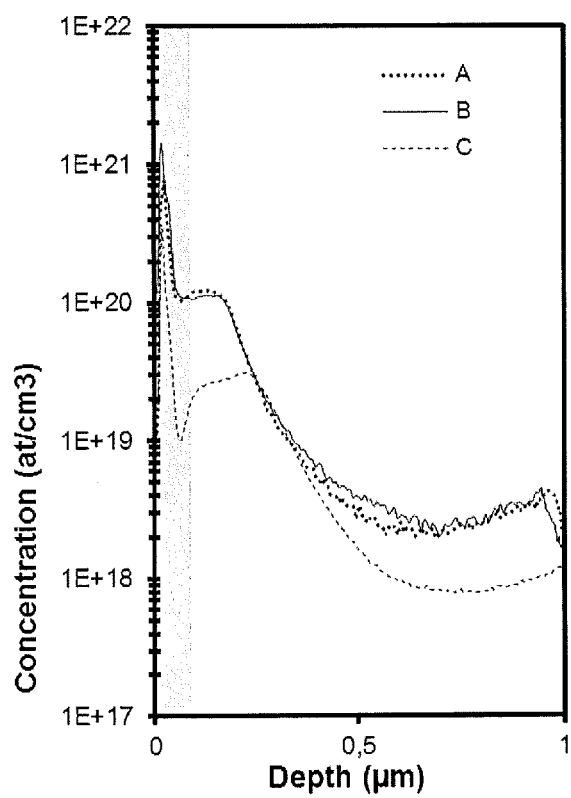
FIG. 8 presents the implantation profile of Mg-type dopants in a GaN-base semiconductor after implementation of a method of the prior art, and after implementation of the present method for different heat treatment temperatures.

The curve plots of FIG. 8 present implantation profiles obtained from a p-doping method of a GaN layer according to the example which has just been described. Plot A is obtained for a substrate that has undergone standard furnace anneals at 1100° C. for 6 hours, whereas plot B is obtained for a substrate that has undergone standard furnace anneals at 1200° C. for 10 minutes. For comparison purposes, plot C corresponds to the implantation profile of a substrate according to the method of the prior art described in the foregoing (cf. FIG. 1).

It is clearly apparent in FIG. 8 that performing successive implantations and heat treatments improves the homogeneity of the dopant concentration in the semiconductor matrix.

Furthermore, the concentration profiles obtained are similar in spite of the differences in implementation of the heat treatments: 1100° C.—6 hours for plot A and 1200° C.—10 minutes for plot B. It is therefore possible to use these heat treatment temperatures indifferently.

It is also noteworthy that the use of a $SiO_2$ cap layer is not detrimental to the quality of the p-doping in semiconductor material layer 1b. This is however counter-intuitive as a cap layer made from $SiO_2$ releases Si atoms when the heat treatments are performed and therefore contributes to the n-doping of the matrix.

As for the substrate doped according to the method of the prior art, a certain quantity of dopant impurities 3 migrates to the surface of semiconductor layer 1b. However, the concentration well disappears with the implemented method, and the concentration plateau present before the heat treatments remains present after the heat treatments. The loss of dose of the dopant species implanted by ion beam is therefore twice as small when the method described above is implemented.

As an alternative to the example which is just been described, it is possible to perform the anneals in an atmosphere containing nitrogen and at high pressure (less than 15 kbar).

While keeping a controlled atmosphere and a high pressure, the heat treatment can be performed at a higher temperature for a shorter period, for example for 1 to 20 minutes at 1200° C., or for 1 to 10 minutes at 1300° C.

If semiconductor material layer 1b is deposited on a sapphire support 1a instead of a silicon support, it is then possible to perform heat treatments at a temperature of up to 1600° C.

It is finally possible to perform heat treatments of RTA/RTP type in a controlled nitrogen atmosphere rather than standard furnace anneals, or to combine them with one another after each dopant impurity implantation step. The temperature ranges used for the RTA/RTP anneals are similar to those used for standard furnace anneals.

It is also possible to modify the implantation conditions by modifying the implantation temperature of the dopant impurities. The latter can be comprised between 15 and 700° C., and preferentially be equal to 500° C. Remaining within this temperature range makes it possible to avoid entering temperature ranges where the surface of the GaN is impaired and where a nitrogen release is observed, these phenomena being all the more likely to occur as semiconductor material layer 1b is subjected to an ion bombardment. This temperature range therefore facilitates both insertion of dopant impurities 3 into the matrix during implantation and reorganization of the matrix in the form of a crystal lattice.

Instead of reducing the implantation energy in monotonic manner at each ion implantation step, it is possible to increase it in monotonic manner to implant dopant impurities 3 more and more deeply.

The method for doping a GaN-base semiconductor enables a particularly high activation ratio of n or p dopant impurities to be obtained, and presents a more homogeneous distribution of the dopant impurities in the matrix compared with methods of the prior art.

Formation of n-doped or p-doped GaN structures is particularly useful for producing high electronic mobility transistors, Schottky diodes and opto-electronic components such as LEDs.

The invention claimed is:

1. A method for performing activation of n-type or p-type dopants in a GaN-base semiconductor layer comprises the following steps:
    providing a substrate comprising a GaN-base semiconductor material layer,
    performing the following successive steps at least twice:
        implanting electric dopant impurities in the semiconductor material layer,
        performing heat treatment so as to activate the electric dopant impurities in the semiconductor material layer, a cap layer covering the semiconductor material layer when the heat treatment is performed,
    wherein at least one of the heat treatment steps is performed at atmospheric pressure at a temperature from 1100° C. to 1300° C. for a period of 1 to 7 hours, and wherein the cap layer remains uncovered during the heat treatment.

2. The dopant activation method according to claim 1, wherein the cap layer is removed after at least one of the heat treatments, and a second cap layer is then deposited on the semiconductor material layer before the next heat treatment.

3. The dopant activation method according to claim 2, wherein the thickness of at least one of the cap layer and the second cap layer is comprised between 5 and 500 nm.

4. The dopant activation method according to claim 1, wherein at least one of the cap layer and the second cap layer is used for several successive heat treatments, and wherein its thickness is comprised between 5 and 500 nm.

5. The dopant activation method according to claim 1, wherein the material of at least one of the cap layer and the second cap layer is selected from the group consisting of $SiO_2$, $Si_3N_4$, and AlN.

6. The dopant activation method according to claim 1, wherein, at each implantation step, an intermediate dose greater than 10% of the total dose to be implanted is implanted.

7. The dopant activation method according to claim 1, wherein at least one of the implantation steps is performed at a temperature comprised between 15 and 700° C.

8. The dopant activation method according to claim 1, wherein, at each new implantation step, the electric dopant impurities are implanted at a different depth from that obtained when the previous implantation steps were performed.

9. The dopant activation method according to claim 1, wherein at least one of the heat treatment steps is performed in a controlled atmosphere at a pressure of less than 15 kbar, at a temperature comprised between 1000° C. and 1600° C. for a period of 1 to 20 minutes.

10. The dopant activation method according to claim 1, wherein at least one of the heat treatment steps is a combination of at least two anneals of different durations and temperatures.

11. The dopant activation method according to claim 1, wherein the electric dopant impurities are selected from the group consisting of Mg, P, N, Ca, Zn, and C to form a p-type doping.

12. The dopant activation method according to claim 1, wherein the electric dopant impurities are selected from the group consisting of Si, Be, Ge, and O to form an n-type doping.

13. A method for performing activation of n-type or p-type dopants in a GaN-base semiconductor layer comprises the following steps:
    providing a substrate comprising a GaN-base semiconductor material layer,
    performing the following successive steps at least twice:
        implanting electric dopant impurities in the semiconductor material layer,
        performing heat treatment so as to activate the electric dopant impurities in the semiconductor material layer, a cap layer covering the semiconductor material layer when the heat treatment is performed,
    wherein the cap layer is removed after at least one of the heat treatments, and a second cap layer is then deposited on the semiconductor material layer before the next heat treatment.

14. The dopant activation method according to claim 13, wherein the thickness of at least one of the cap layer and the second cap layer is comprised between 5 and 500 nm.

15. The dopant activation method according to claim 13, wherein the material of at least one of the cap layer and the second cap layer is selected from the group consisting of $SiO_2$, $Si_3N_4$, and AlN.

16. The dopant activation method according to claim 13, wherein at least one of the heat treatment steps is a combination of at least two anneals of different durations and temperatures.

17. A method for performing activation of n-type or p-type dopants in a GaN-base semiconductor layer comprises the following steps:
    providing a substrate comprising a GaN-base semiconductor material layer,
    performing the following successive steps at least twice:
        implanting electric dopant impurities in the semiconductor material layer,
        performing heat treatment so as to activate the electric dopant impurities in the semiconductor material layer, a cap layer covering the semiconductor material layer when the heat treatment is performed,
    wherein, at each new implantation step, the electric dopant impurities are implanted at a different depth from that obtained when the previous implantation steps were performed.

18. The dopant activation method according to claim 17, wherein the cap layer is removed after at least one of the heat treatments, and a second cap layer is then deposited on the semiconductor material layer before the next heat treatment.

19. The dopant activation method according to claim 17, wherein, at each implantation step, an intermediate dose greater than 10% of the total dose to be implanted is implanted.

20. The dopant activation method according to claim 17, wherein at least one of the heat treatment steps is a combination of at least two anneals of different durations and temperatures.

* * * * *